(12) United States Patent
Bell et al.

(10) Patent No.: US 6,664,154 B1
(45) Date of Patent: Dec. 16, 2003

(54) METHOD OF USING AMORPHOUS CARBON FILM AS A SACRIFICIAL LAYER IN REPLACEMENT GATE INTEGRATION PROCESSES

(75) Inventors: Scott A. Bell, San Jose, CA (US); Srikanteswara Dakshina-Murthy, Austin, TX (US); Philip A. Fisher, Foster City, CA (US); Cyrus E. Tabery, Sunnyvale, CA (US)

(73) Assignee: Advanced Micro Devices, Inc.

( * ) Notice: Subject to any disclaimer, the term of this patent is extended or adjusted under 35 U.S.C. 154(b) by 0 days.

(21) Appl. No.: 10/185,320

(22) Filed: Jun. 28, 2002

(51) Int. Cl.[7] .............................................. H01L 21/336
(52) U.S. Cl. .................... 438/197; 438/259; 438/270; 438/780; 438/785; 438/626; 438/648
(58) Field of Search ................... 438/780, 224, 438/197, 259, 270, 297, 648, 626, 637, 99, 672; 257/249, E21.625, 330, 334, E21.193

(56) References Cited

U.S. PATENT DOCUMENTS

| | | | | |
|---|---|---|---|---|
| 5,960,270 A | * | 9/1999 | Misra et al. ................ | 438/197 |
| 6,159,782 A | * | 12/2000 | Xiang et al. ................ | 438/197 |
| 6,184,097 B1 | * | 2/2001 | Yu ............................. | 438/299 |
| 6,200,865 B1 | * | 3/2001 | Gardner et al. ............. | 438/291 |
| 6,232,188 B1 | * | 5/2001 | Murtaza et al. ............. | 438/300 |
| 6,248,675 B1 | * | 6/2001 | Xiang et al. ........... | 257/E21.193 |
| 6,436,775 B2 | * | 8/2002 | Kim et al. ................... | 438/301 |
| 6,479,336 B2 | * | 11/2002 | Kim .......................... | 438/197 |
| 6,495,437 B1 | * | 12/2002 | Yu ............................. | 438/591 |
| 6,534,352 B1 | * | 3/2003 | Kim .......................... | 438/197 |
| 6,544,822 B2 | * | 4/2003 | Kim et al. ................... | 438/142 |
| 6,551,885 B1 | * | 4/2003 | Yu ............................. | 438/300 |

* cited by examiner

Primary Examiner—Matthew Smith
Assistant Examiner—Belur Keshavan
(74) Attorney, Agent, or Firm—Foley & Lardner

(57) ABSTRACT

An exemplary embodiment relates to a method of using amorphous carbon in replacement gate integration processes. The method can include depositing an amorphous carbon layer above a substrate, patterning the amorphous carbon layer, depositing a dielectric layer over the patterned amorphous carbon layer, removing a portion of the deposited dielectric layer to expose a top of the patterned amorphous carbon layer, removing the patterned amorphous carbon layer leaving an aperture in the dielectric layer, and forming a metal gate in the aperture of the dielectric layer.

20 Claims, 6 Drawing Sheets

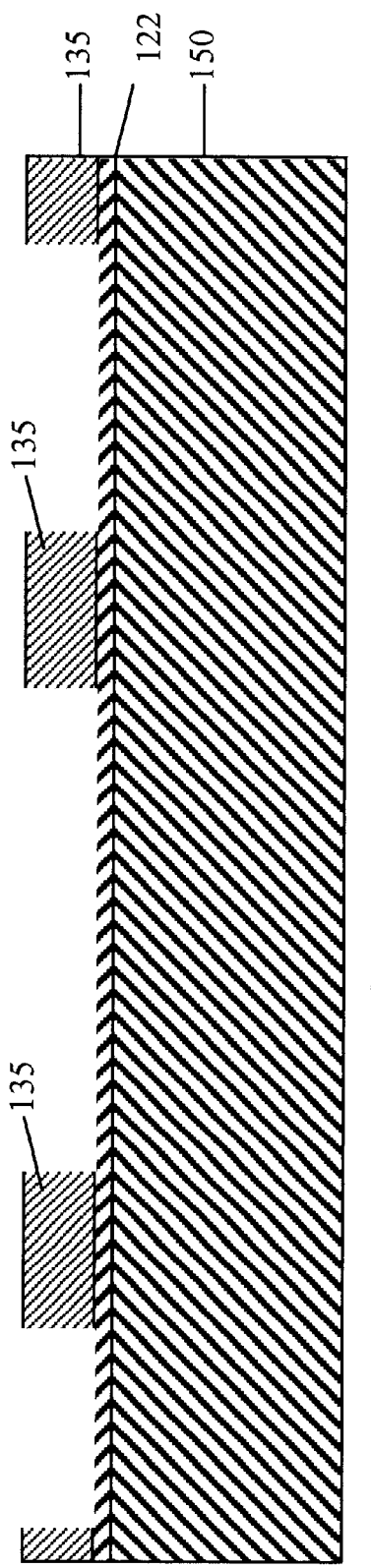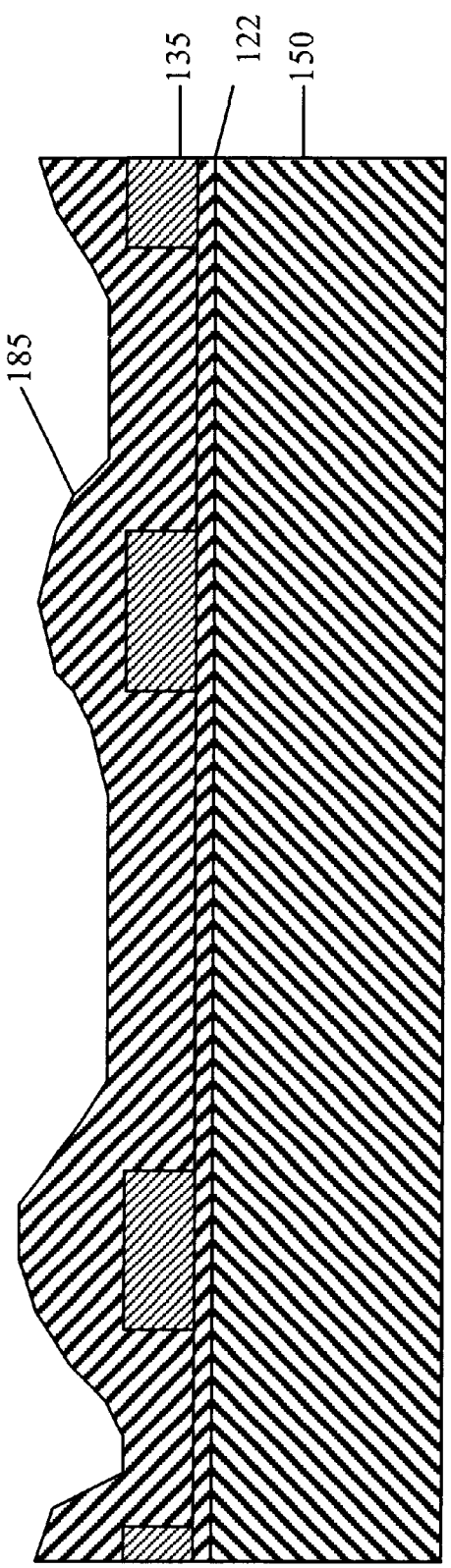

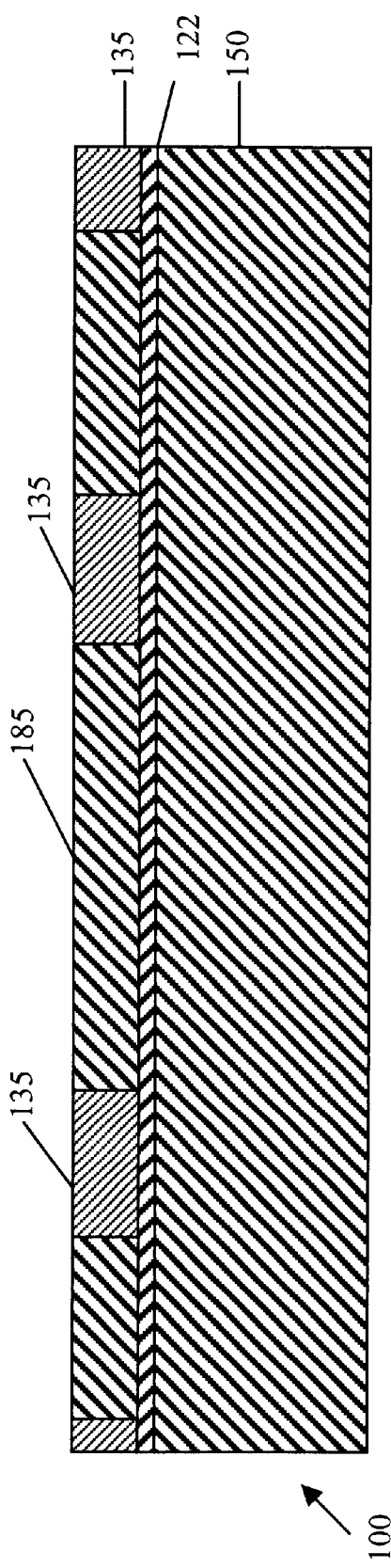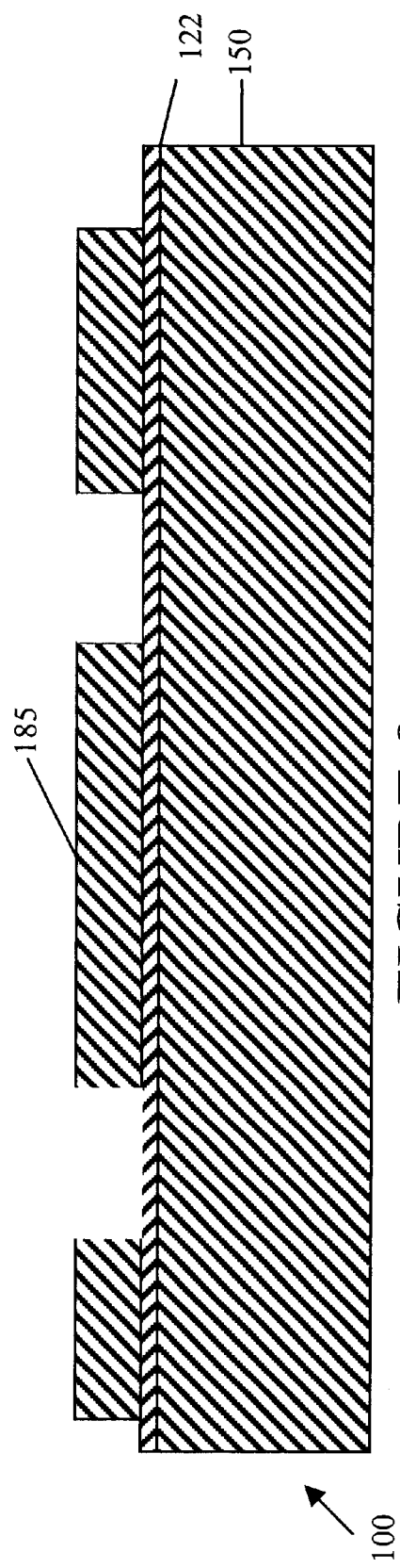
FIGURE 8
FIGURE 9

METHOD OF USING AMORPHOUS CARBON FILM AS A SACRIFICIAL LAYER IN REPLACEMENT GATE INTEGRATION PROCESSES

FIELD OF THE INVENTION

The present disclosure relates generally to integrated circuits and methods of manufacturing integrated circuits. More particularly, the present disclosure relates to a method of using amorphous carbon film as a sacrificial layer in replacement gate integration processes.

BACKGROUND OF THE INVENTION

Deep-submicron complementary metal oxide semiconductor (CMOS) is conventionally the primary technology for ultra-large scale integrated (ULSI) circuits. Over the last two decades, reduction in the size of CMOS transistors has been a principal focus of the microelectronics industry.

Transistors, such as, MOSFETs, are often built on the top surface of a bulk substrate. The substrate is doped to form source and drain regions, and a conductive layer is provided between the source and drain regions. The conductive layer operates as a gate for the transistor; the gate controls current in a channel between the source and the drain regions.

Ultra-large-scale integrated (ULSI) circuits generally include a multitude of transistors, such as, more than one million transistors and even several million transistors that cooperate to perform various functions for an electronic component. The transistors are generally complementary metal oxide semiconductor field effect transistors (CMOSFETs) which include a gate conductor disposed between a source region and a drain region. The gate conductor is provided over a thin gate oxide material. Generally, the gate conductor can be a metal, a polysilicon, or polysilicon/germanium ($Si_xGe_{(1-x)}$) material that controls charge carriers in a channel region between the drain and the source to turn the transistor on and off. Conventional processes typically utilize polysilicon based gate conductors because metal gate conductors are difficult to etch, are less compatible with front-end processing, and have relatively low melting points. The transistors can be N-channel MOSFETs or P-channel MOSFETs.

Conventional polysilicon-based gate conductors must be doped and annealed to achieve a suitable conductivity. Generally, the annealing process can adversely affect the formation of source/drain extensions, and pocket regions. For example, the high thermal budget can cause transient enhanced diffusion (TED). Further, the high thermal budget can preclude the use of high-K gate dielectric materials.

Replacement gate processes have been proposed in which a sacrificial gate material is removed after source/drain formation. The sacrificial gate material (e.g., polysilicon) is then replaced with a metal material that does not require the doping and annealing steps of a polysilicon-based gate conductors. However, such processes can damage the substrate when removing the sacrificial gate material. Further, such processes have not been utilized with amorphous carbon lithographic processes which can achieve smaller critical dimensions.

Generally, it is desirous to manufacture smaller transistors to increase the component density on an integrated circuit. It is also desirous to reduce the size of integrated circuit structures, such as vias, conductive lines, capacitors, resistors, isolation structures, contacts, interconnects, etc. For example, manufacturing a transistor having a reduced gate length (a reduced width of the gate conductor) can have significant benefits. Gate conductors with reduced widths can be formed more closely together, thereby increasing the transistor density on the IC. Further, gate conductors with reduced widths allow smaller transistors to be designed, thereby increasing speed and reducing power requirements for the transistors.

Thus, there is a need to form metal gates using an improved method. Further, there is a need to use amorphous carbon as a sacrificial layer in replacement gate integration processes. Even further, there is a need to avoid the difficulties of etching a metal gate directly while using a process capable of achieving small critical dimensions (CDs).

SUMMARY OF THE INVENTION

An exemplary embodiment relates to a method of using amorphous carbon in replacement gate integration processes. The method can include depositing an amorphous carbon layer above a substrate, patterning the amorphous carbon layer, depositing a dielectric layer over the patterned amorphous carbon layer, removing a portion of the deposited dielectric layer to expose a top of the patterned amorphous carbon layer, removing the patterned amorphous carbon layer leaving an aperture in the dielectric layer, and forming a metal gate in the aperture of the dielectric layer.

Another exemplary embodiment relates to a method of forming a metal gate using a sacrificial amorphous carbon structure. The method can include patterning an amorphous carbon layer to form a sacrificial amorphous carbon structure, forming a material layer over the sacrificial amorphous carbon structure, polishing the material layer to expose the sacrificial amorphous carbon structure, removing the sacrificial amorphous carbon structure, and forming a metal gate structure where the sacrificial amorphous carbon structure was located before removal.

Another exemplary embodiment relates to a method of using amorphous carbon in the formation of a metal structure. The method can include forming an amorphous carbon structure having a critical dimension corresponding to a desired critical dimension for a metal structure, forming a first oxide layer adjacent a first side of the amorphous carbon structure and a second oxide layer adjacent a second side of the amorphous carbon structure, and replacing the amorphous carbon structure with a metal structure.

Other principle features and advantages of the invention will become apparent to those skilled in the art upon review of the following drawings, the detailed description, and the appended claims.

BRIEF DESCRIPTION OF THE DRAWINGS

The exemplary embodiments of the disclosure will hereafter be described with reference to the accompanying drawings, wherein like numerals denote like elements, and:

FIG. 6 is a schematic cross-sectional view representation of the portion of the integrated circuit of FIG. 2, showing a removal operation;

FIG. 7 is a schematic cross-sectional view representation of the portion of the integrated circuit of FIG. 2, showing a dielectric deposition operation;

FIG. 8 is a schematic cross-sectional view representation of the portion of the integrated circuit of FIG. 2, showing a polishing operation;

FIG. 9 is a schematic cross-sectional view representation of the portion of the integrated circuit of FIG. 2, showing a removal operation;

DETAILED DESCRIPTION OF EXEMPLARY EMBODIMENTS

Figure 1:
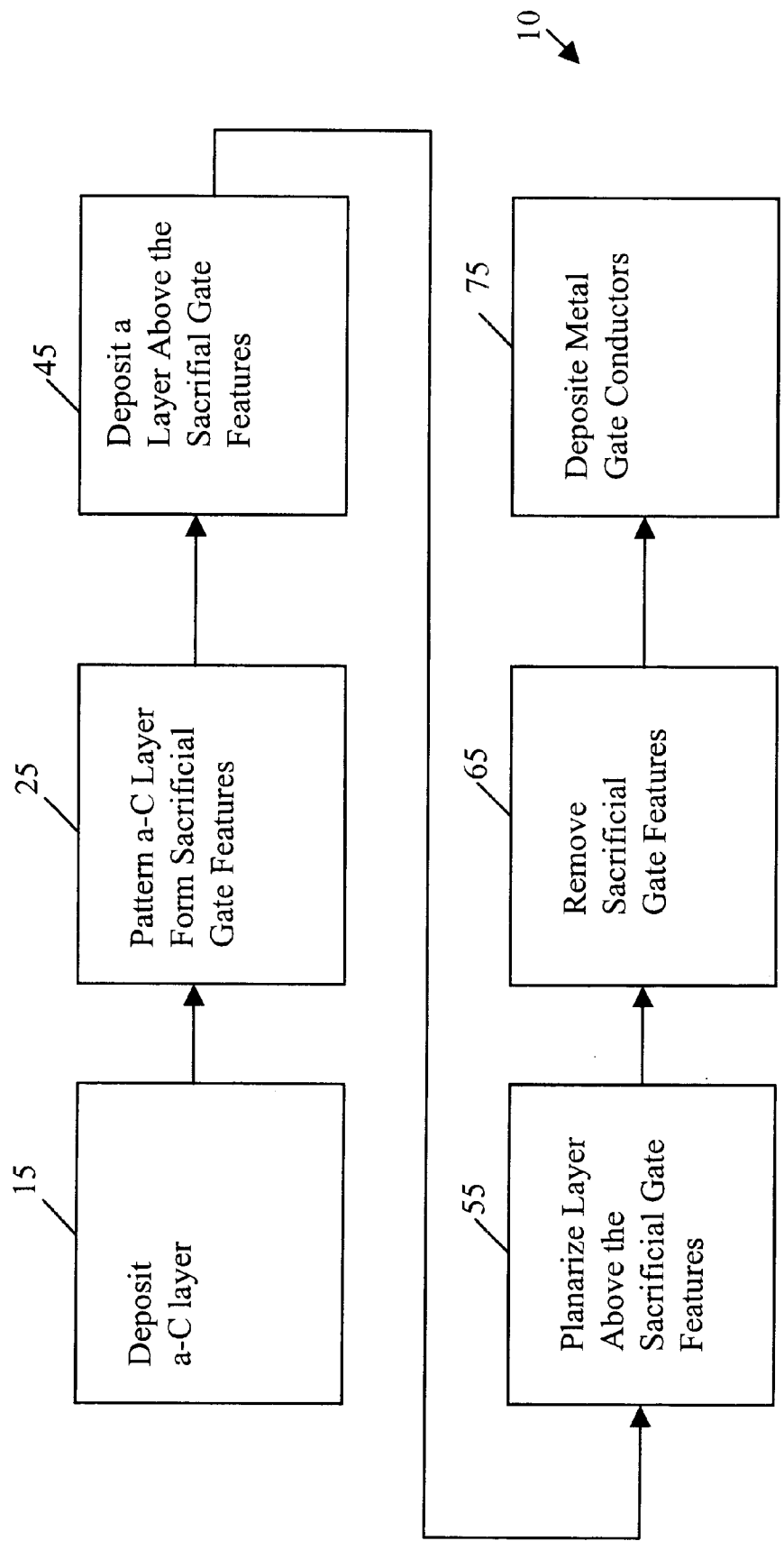
FIG. 1 is a flow diagram for a process of using amorphous carbon film as a sacrificial layer in replacement gate integration processes in accordance with an exemplary embodiment.

FIG. 1 illustrates a flow diagram 10 of an exemplary process of using amorphous carbon film as a sacrificial layer and replacement gate integrated processes. Flow diagram 10 illustrates by way of example some steps that may be performed. Additional steps, fewer steps, or combination of steps may be utilized in various different embodiments.

In an exemplary embodiment, a step 15 is performed in which an amorphous carbon layer is deposited. The amorphous carbon layer can be deposited using a chemical vapor deposition (CVD) operation or other suitable deposition technique. One exemplary amorphous carbon layer deposition operation is described below with reference to FIG. 2.

In a step 25, the amorphous carbon layer is patterned to form sacrificial gate features. The amorphous carbon layer can be patterned using a variety of different techniques. An exemplary patterning operation is described below with reference to FIGS. 4–5.

In a step 45, a layer is deposited above the sacrificial gate's features. Such a deposited layer can be a dielectric layer, such as an oxide. The deposited layer can be a tetraethyl orthosilicate (TEOS) layer. The layer can be deposited using plasma enhanced chemical vapor deposition (PECBD). An exemplary layer deposition operation is described below with reference to FIG. 7.

In a step 55, the layer above the sacrificial gate features is planarized. In an exemplary embodiment, a chemical mechanical polish (CMP) operation is used to remove portions of the dielectric layer and planarize the layer with the sacrificial gate features. One exemplary planarization operation is described below with reference to FIG. 8.

In a step 65, sacrificial gate features are removed. Sacrificial gate features can be removed using an ashing operation. One exemplary removal operation is described below with reference to FIG. 9. Ashing can involve the introduction of a $O_2$ plasma.

In a step 75, metal gate conductors are deposited in a location where sacrificial gate features were present before removal. Formation of metal gate conductors can include deposition of a metal material layer, such as the deposition operation described below with reference to FIG. 10. The metal material layer is then polished down to the level of the dielectric layer using a removal process, such as the removal operation described below with reference to FIG. 11.

Figure 2:
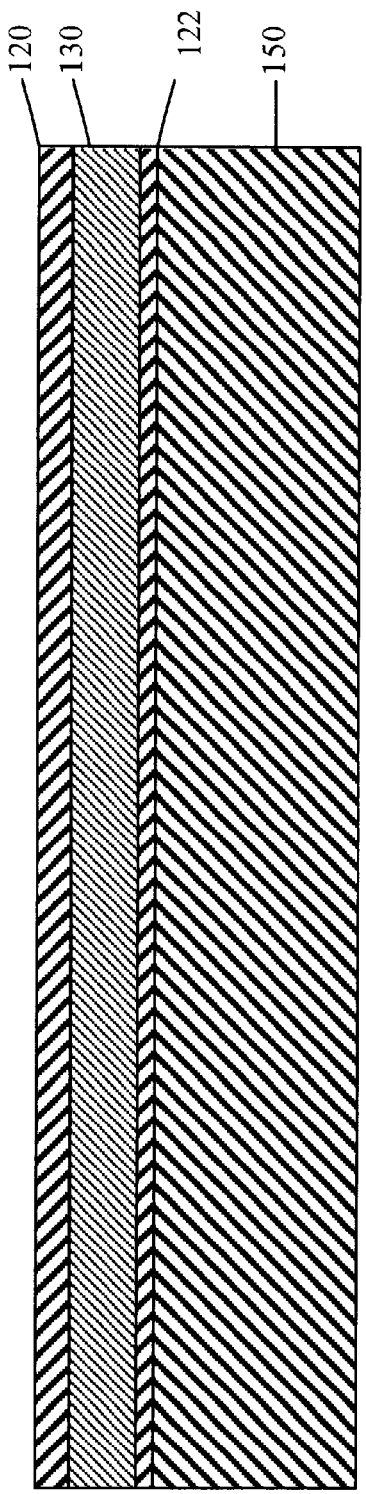
FIG. 2 is a schematic cross-sectional view representation of a portion of a integrated circuit, showing a stack application operation in accordance with an exemplary embodiment.

Referring to FIG. 2, a portion 100 of an integrated circuit includes an anti-reflective coating (ARC) layer 120, an amorphous carbon layer 130, a gate dielectric layer 122, and a substrate 150. ARC layer 120 can be a layer including silicon oxide nitride (SiON). While a SiON material is preferably used in ARC layer 120, alternatively other oxides and suitable materials can be used.

In an exemplary embodiment, ARC layer 120 has a thickness of 5–100 nm. ARC layer 120 is provided above amorphous carbon layer 130. Amorphous carbon layer 130 has a thickness of, for example, 60 nm. ARC layer 120 and amorphous carbon layer 130 can be deposited using any of a variety of deposition techniques, such as chemical vapor deposition (CVD). Gate dielectric layer 122 can have a thickness of <40 Angstroms and can include dielectric materials, such as, $SiO_xN_y$ or $HfSi_xO_y$, or $Hf_xAl_ySi_zO\alpha$. In at least one exemplary embodiment, high-K gate dielectric materials are used in gate dielectric layer 122.

Figure 3:
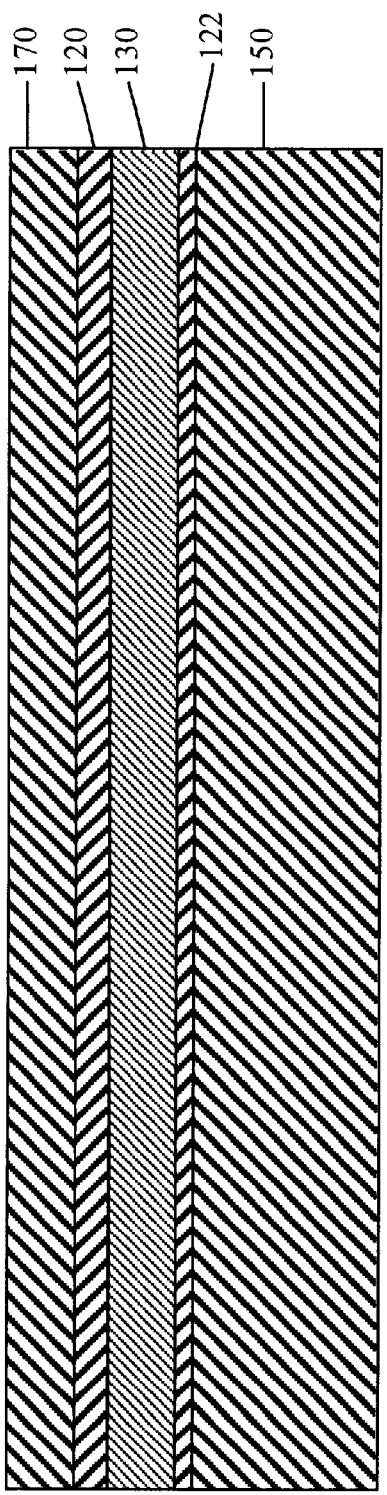
FIG. 3 is a schematic cross-sectional view representation of the portion of the integrated circuit of FIG. 2, showing a photoresist application operation.

FIG. 3 illustrates portion 100 after application of a photoresist layer 170. Photoresist layer 170 is provided above ARC layer 120 and can have a thickness between 100 nm and 500 nm. In an exemplary embodiment, photoresist layer 170 can be provided using a spin-on process.

Figure 4:
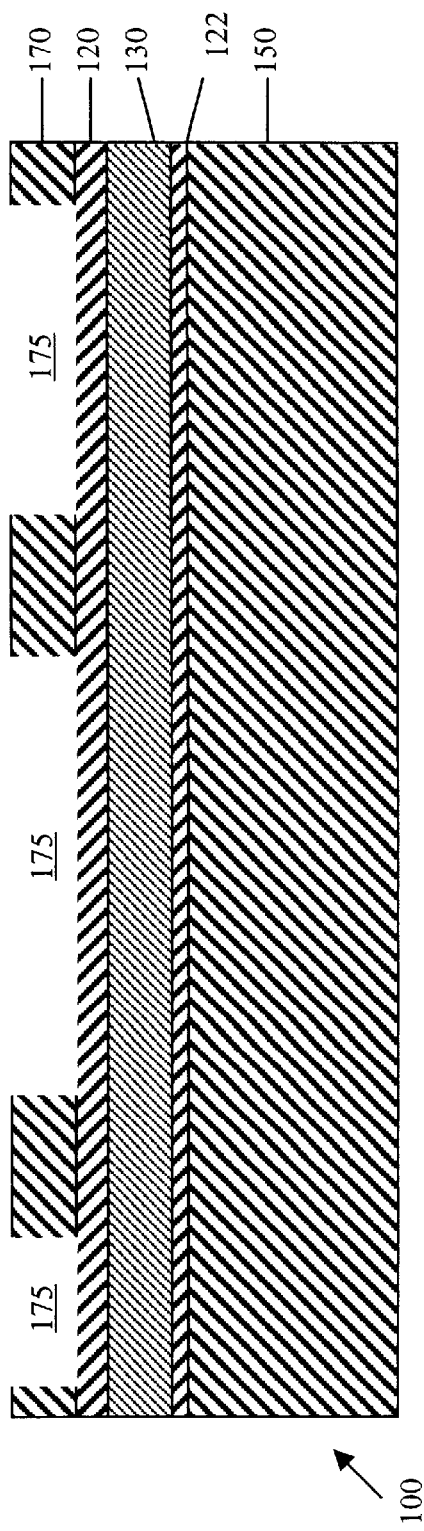
FIG. 4 is a schematic cross-sectional view representation of the portion of the integrated circuit of FIG. 2, showing a patterning operation.

FIG. 4 illustrates portion 100 after patterning of photoresist layer 170. Photoresist layer 170 can be patterned to form apertures 175. In an exemplary embodiment, apertures 175 have a critical dimension (i.e., width) of 200 nm. Alternatively, aperture 175 can have critical dimensions of between 50 nm and 800 nm.

Figure 5:
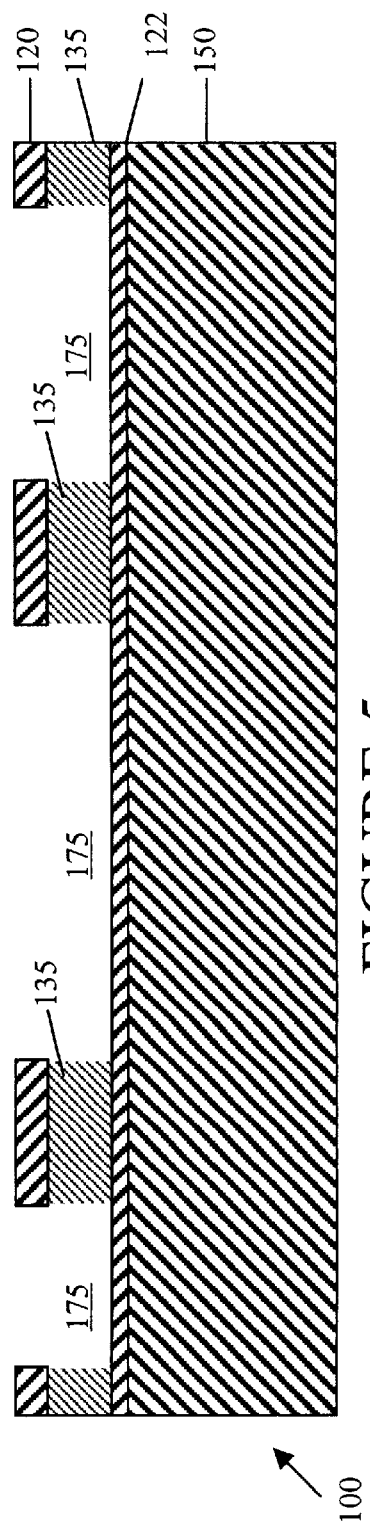
FIG. 5 is a schematic cross-sectional view representation of the portion of the integrated circuit of FIG. 2, showing a patterning operation.

FIG. 5 illustrates portion 100 after etching ARC layer 120 and amorphous carbon layer 130 to extend apertures 175 to ARC layer 120 and amorphous carbon layer 130. A variety of techniques may be used to extend aperture 175 into ARC layer 120 and amorphous carbon layer 130. The patterning of amorphous carbon layer 130 forms sacrificial amorphous carbon structures 135.

In an exemplary embodiment, an etching technique is used whereby photoresist layer 170 and ARC layer 120 are removed during the patterning of amorphous carbon layer 130. Alternatively, photoresist layer 170 can be removed during the etching of ARC layer 120 and amorphous carbon layer 130, and ARC layer 120 is subsequently removed.

FIG. 6 illustrates portion 100 after removal of ARC layer 120. ARC layer 120 can be removed using a plasma etch or reactive ion etching or wet etch (hot phosphoric acid) process. As described above, in an alternative embodiment, ARC layer 120 can be removed during the etching of ARC layer 120 and photoresist layer 170 described with reference to FIG. 5. Alternatively, the ARC layer can remain on the stack to be removed later during the chemical mechanical polish (CMP) process.

FIG. 7 illustrates portion 100 after a deposition of a dielectric film 185 over sacrificial amorphous carbon structures 135 and gate dielectric layer 122. Dielectric layer 185 can be conformally deposited using a variety of different techniques. In an exemplary embodiment, dielectric layer 185 is deposited using a plasma enhanced chemical vapor deposition (PECVD) operation.

FIG. 8 illustrates portion 100 after a polishing of dielectric layer 185 to planarize dielectric layer 185 with sacrificial amorphous carbon structures 135. Portions of dielectric layer 185 are removed such that dielectric layer 185 has a cross-sectional height approximately equivalent to the cross-sectional height of sacrificial amorphous carbon structures 135.

FIG. 9 illustrates portion 100 after removal of sacrificial amorphous carbon structures 135. Sacrificial amorphous carbon structures 135 can be removed using an ashing operation which introduces a $O_2$ plasma. Advantageously, use of an ashing operation provides the ability to remove the dummy gate material (amorphous carbon) using a downstream plasma process. Other materials, such as polysilicon, do not lend themselves to such low damage plasma processing and likely require the use of more energetic reactive ion etching processes.

Figure 10:
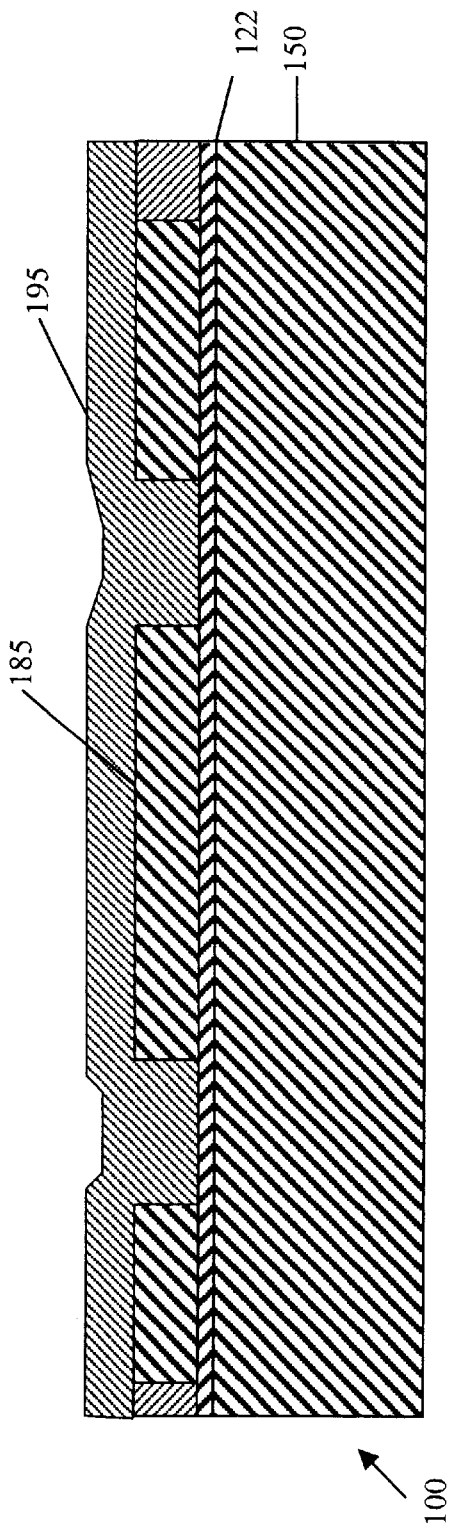
FIG. 10 is a schematic cross-sectional view representation of the portion of the integrated circuit of FIG. 2, showing a metal deposition operation.

FIG. 10 illustrates portion 100 after deposition of a metal layer 195. Metal layer 195 is deposited over dielectric layer 185 and fills spaces remaining from removal of sacrificial amorphous carbon structures 135. Metal layer 195 can contain a variety of metal materials, such as Mo, W, Ta, CoSi, NiSi and poly Si, or any similarly conductive material or alloy.

Figure 11:
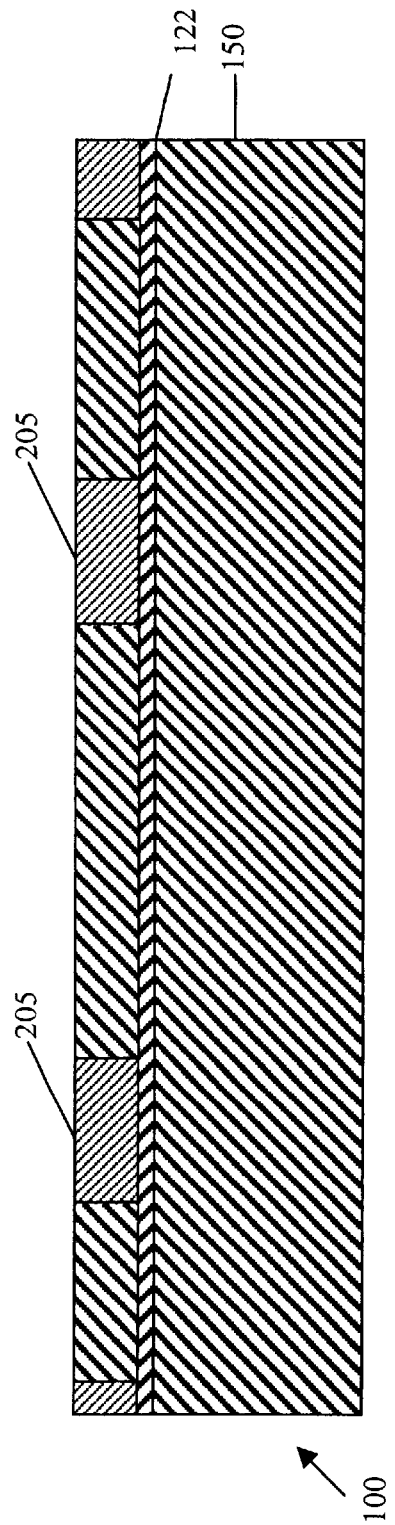
FIG. 11 is a schematic cross-sectional view representation of the portion of the integrated circuit of FIG. 2, showing a polishing operation.

FIG. 11 illustrates portion 100 after a polishing operation of metal layer 195 to form metal gates 205 in spaces where previously patterned amorphous carbon layer 130 was located.

Advantageously, a metal gate can be formed where sacrificial amorphous carbon gate structures were. As such, a small critical dimension (CD) can be achieved while avoiding the difficulties of etching a metal gate directly. The process described with reference to FIGS. 1–11 also avoid the incapability of metal processing with front end processes.

While the exemplary embodiments illustrated in the FIGURES and described above are presently preferred, it should be understood that these embodiments are offered by way of example only. Other embodiments may include, for example, different material layers as well as additional or combined steps in the process. The invention is not limited to a particular embodiment, but extends to various modifications, combinations, and permutations that nevertheless fall within the scope and spirit of the appended claims.

What is claimed is:

1. A method of using amorphous carbon in replacement gate integration processes, the method comprises:
   depositing an amorphous carbon layer above a substrate;
   patterning the amorphous carbon layer;
   depositing a dielectric layer over the patterned amorphous carbon layer;
   removing a portion of the deposited dielectric layer to expose a top of the patterned amorphous carbon layer;
   removing the patterned amorphous carbon layer leaving an aperture in the dielectric layer; and
   forming a metal gate in the aperture of the dielectric layer.

2. The method of claim 1, wherein a gate dielectric layer is located between the amorphous carbon layer and the substrate.

3. The method of claim 1, wherein removing a portion of the deposited dielectric layer to expose a top of the patterned amorphous carbon layer includes performing a chemical mechanical polish (CMP).

4. The method of claim 1, wherein removing the patterned amorphous carbon layer leaving an aperture in the dielectric layer includes ashing away the patterned amorphous carbon layer with $O_2$ plasma.

5. The method of claim 1, wherein forming a metal gate in the aperture of the dielectric layer includes depositing metal material and chemical mechanical polishing the metal material to a level substantially planar with a top of the dielectric layer.

6. The method of claim 1, wherein the dielectric layer is a TEOS layer.

7. The method of claim 1, wherein the patterned amorphous carbon layer has a width of between 50 nm and 800 nm.

8. The method of claim 1, wherein the metal gate has a critical dimension of 5 nm to 150 nm.

9. The method of claim 1, wherein the metal gate includes the material of Mo.

10. A method of forming a metal gate using a sacrificial amorphous carbon structure, the method comprising:
    patterning an amorphous carbon layer to form a sacrificial amorphous carbon structure;
    forming a material layer over the sacrificial amorphous carbon structure;
    polishing the material layer to expose the sacrificial amorphous carbon structure;
    removing the sacrificial amorphous carbon structure, and
    forming a metal gate structure where the sacrificial amorphous carbon structure was located before removal.

11. The method of claim 10, wherein the material layer is a TEOS layer.

12. The method of claim 10, wherein the metal gate structure has a critical dimension (CD) of between 5 nm and 150 nm.

13. The method of claim 10, wherein removing the sacrificial amorphous carbon structure includes ashing the sacrificial amorphous carbon structure with $O_2$ plasma.

14. The method of claim 10, wherein forming a metal gate structure where the sacrificial amorphous carbon structure was located before removal includes depositing a metal material and polishing the deposited metal material to the material layer.

15. The method of claim 14, wherein the metal material is tungsten (W).

16. A method of using amorphous carbon in the formation of a metal structure, the method comprising:
    forming an amorphous carbon structure having a critical dimension corresponding to a desired critical dimension for a metal structure;
    forming a first oxide layer adjacent a first side of the amorphous carbon structure and a second oxide layer adjacent a second side of the amorphous carbon structure; and
    replacing the amorphous carbon structure with a metal structure.

17. The method of claim 16, wherein the metal structure is a gate.

18. The method of claim 16, wherein the critical dimension is 5 nm to 150 nm.

19. The method of claim 16, wherein replacing the amorphous carbon structure with a metal structure includes ashing away the amorphous carbon structure.

20. The method of claim 16, wherein the amorphous carbon structure is formed over a dielectric layer.

\* \* \* \* \*